United States Patent [19]

Watts

[11] Patent Number: 5,124,647
[45] Date of Patent: Jun. 23, 1992

[54] CONTACT TESTING DEVICE

[75] Inventor: Vivian C. Watts, Trowbridge, United Kingdom

[73] Assignee: Bath Scientific Limited, United Kingdom

[21] Appl. No.: 651,215

[22] PCT Filed: Aug. 17, 1989

[86] PCT No.: PCT/GB89/00959
§ 371 Date: Feb. 7, 1991
§ 102(e) Date: Feb. 7, 1991

[87] PCT Pub. No.: WO90/02340
PCT Pub. Date: Mar. 8, 1990

[30] Foreign Application Priority Data

Aug. 24, 1988 [GB] United Kingdom ............... 8820042

[51] Int. Cl.⁵ .............................. G01R 27/04
[52] U.S. Cl. .............. 324/158 P; 324/72.5; 324/73.1; 324/158 R
[58] Field of Search .......... 324/158 F, 158 P, 158 R, 324/72.5, 537, 568, 538; 439/482; 371/15.1, 16.1

[56] References Cited

U.S. PATENT DOCUMENTS

| | | | |
|---|---|---|---|
| 4,175,253 | 11/1979 | Pitegoff | 324/537 |
| 4,229,693 | 10/1980 | Irick et al. | 324/158 F |
| 4,342,958 | 8/1982 | Russell | 324/537 |
| 4,565,966 | 1/1986 | Burr et al. | 324/158 F |
| 4,780,836 | 10/1988 | Miyazaki et al. | 324/158 P |
| 5,006,808 | 4/1991 | Watts | 324/158 F |
| 5,019,771 | 5/1991 | Yang et al. | 324/158 F |

*Primary Examiner*—Vinh Nguyen
*Attorney, Agent, or Firm*—Robbins, Dalgarn, Berliner & Carson

[57] ABSTRACT

For detecting whether a probe (P) is in contact with an electrical circuit under test (U), capacitance measurement means (M) measures the capacitance between the probe and a reference (G), without the probe contacting the circuit. The measured capacitance is stored in control circuitry (T) and then a capacitance value is measured between the probe and the reference with the probe in a position in which it is assumed to be in contact with the circuit, the control circuitry comparing the measured value with the stored capacitance.

4 Claims, 1 Drawing Sheet

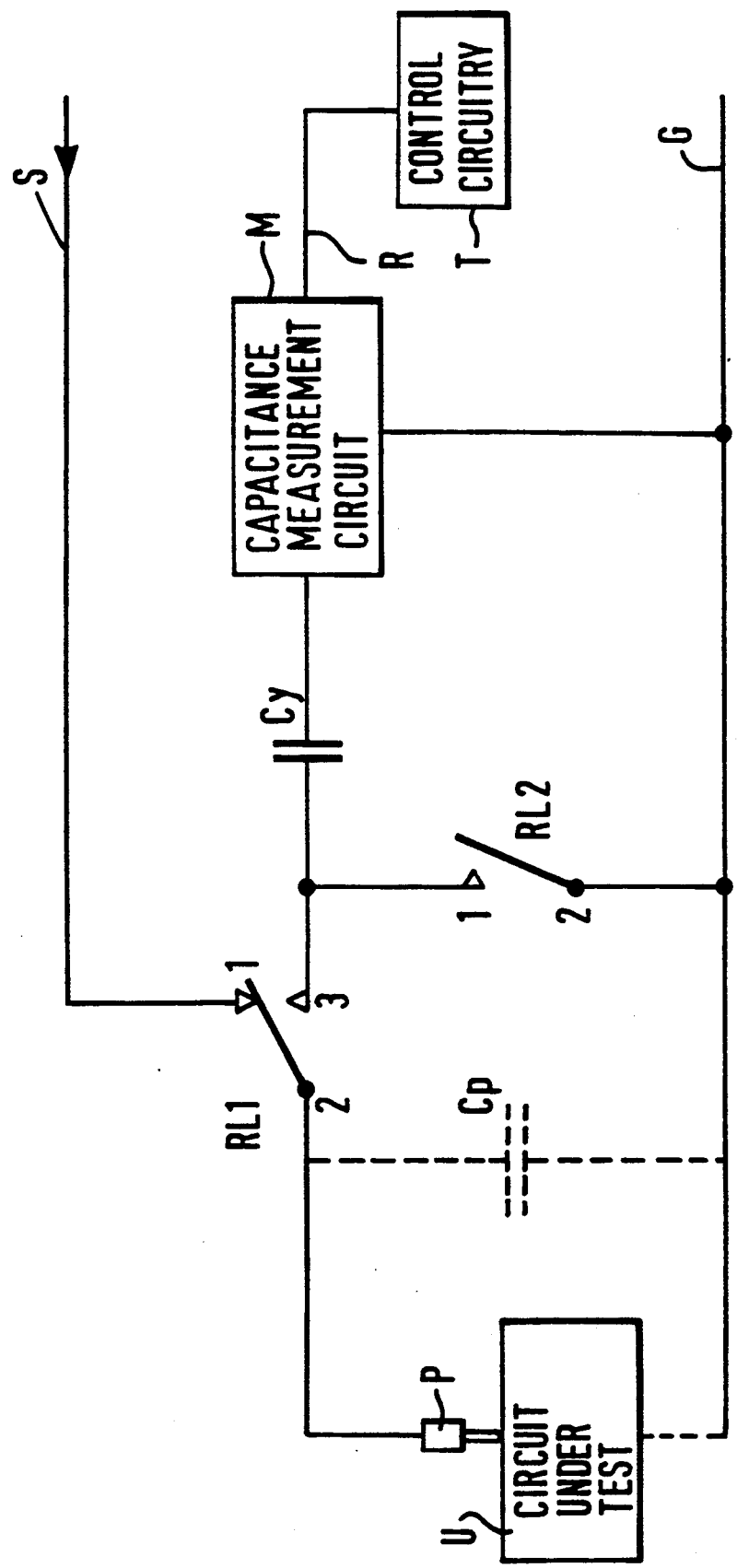

CONTACT TESTING DEVICE

The present invention relates to electrical circuit testing, more particularly to detecting whether or not a testing probe is in contact with a circuit to be tested.

Various methods are known for testing electrical circuits, using at least one testing probe. For example, at least one such probe may be used in testing automatically a printed circuit board before components are added, by testing conductive tracks for open circuit faults and/or short circuit faults on the basis of capacitance value checks with reference to a ground plane or resistance value checks or a combination of such checks.

However, if a probe does not make proper contact with a conductive track or an end terminal of such a track, then faulty readings will be derived from the probe.

According to the present invention from one aspect, there is provided a method for detecting whether a testing probe is in contact with a circuit to be tested, the method comprising obtaining a measure of an impedance value between the probe and a reference and comparing the measure with a measure of the impedance taken without the probe contacting the circuit.

According to the present invention from another aspect, there is provided apparatus for detecting whether a testing probe is in contact with a circuit to be tested, the apparatus comprising means for obtaining a measure of an impedance value between the probe and a reference and means for comparing the measure with a measure of the impedance taken without the probe contacting the circuit.

The present invention will now be described, by way of example, with reference to the accompanying drawing which is a schematic representation of an embodiment of apparatus according to the present invention.

Referring to the single FIGURE of the accompanying drawing, reference P denotes a testing probe for use in making contact with a circuit under test U for testing the latter. Located close to the probe P is a capacitance measurement circuit M connectable to the probe P via a relay RL1 and isolated from the latter by a capacitor Cy. Relay RL1 has a contact which connects either terminals 1 and 2 or terminals 3 and 2 of the relay. Connected between terminal 3 of relay RL1 and ground (G) is a relay RL2, which normally provides an open circuit between its terminals 1 and 2. The normal electrical path to the probe P for testing purposes is via an input S and terminals 1 and 2 and the contact of relay RL1.

For the purpose of enabling a subsequent check as to whether, in use, the probe P is actually in contact with a circuit under test, first the probe is removed from any circuit which happens to be under test. Then, under the control of circuitry T, relay RL1 is put into a state such that its contact connects its terminals 2 and 3 so that the capacitive measurement circuit M is connected to the probe P via capacitor Cy. The circuit M then, under the control of circuitry T, makes a measurement of capacitance, which measurement will be of the effect of the capacitor Cy and the stray capacitance (Cp) of the probe P and its associated wiring and is stored as a background reading in control circuitry T via an output R.

The probe P is then moved to a circuit under test to make contact with it. A capacitance measurement (Cm) is then made by circuit M, which will be of the combined effect of the capacitor Cy, the stray capacitance Cp of the probe P and its associated wiring and the added electrical effect of making contact to the circuit under test if the latter has occurred. If there is no other direct connection from the circuit under test to ground G, the capacitance added by the circuit under test can be represented solely by Cx, where:

$$\frac{1}{Cm} = \frac{1}{Cp + Cx} + \frac{1}{Cy}$$

The background measurement value of the capacitance effect of capacitor Cy and the stray capacitance Cp of the probe P and its associated wiring with the probe not making contact with a circuit under test is then compared automatically with Cm by circuitry T. If they are the same, then it is assumed that the probe P has not contacted the circuit under test. If Cm is different from (in the present embodiment, greater than) the background measurement, then it is assumed that the probe P has made contact with the circuit under test. More particularly, in the present embodiment, if the circuit under test has components representing a complex impedance relative to ground, Cm will be increased above the series effect of Cy and Cp alone if the probe P makes contact with the circuit under test. If it happens that the circuit under test has a short circuit to ground, then Cm=Cy.

On the one hand, the capacitor Cy protects the capacitance measurement circuit M from voltages which may be present on the circuit under test and, on the other hand, the capacitor Cy protects circuitry of the circuit under test from signals which may be generated by the action of the capacitance measurement circuit M.

A voltage present on the probe P when making a capacitance measurement will not prevent a valid measurement being made of capacitance at the probe tip.

When it has been established that the probe P has contacted the circuit under test under the control of circuitry T, the relay RL1 is put into the state such that its contact connects its terminals 1 and 2 to connect the probe to input S for testing the circuit under test. Also, relay RL2 is put into the state such that its contact connects its terminals 1 and 2, to discharge any voltage on capacitor Cy which may cause damage to the circuit under test.

Each of relays RL1 and RL2 may be replaced by a mechanical switch or any semi-conductor means of routing electrical paths.

The capacitance measurement circuit M can be of the type which measures the time taken to charge the circuit under test with a constant or semi-constant current between two specified voltage limits.

The probe P can be any mechanical device designed to make electrical contact, which can be applied by manual intervention or automatically by electrical, hydraulic, pneumatic or any other powered means.

Capacitance variation due to movement of the probe P can be nulled out by making background measurements with a probe in a position which would be its normal connective position to the circuit under test without the circuit under test being physically in that position.

A conductive surface of the circuit under test may be electrically connected by capacitive, inductive or resistive means to other electrical parts. Also, the conductive surface may be electrically "live" when the contact verification is made.

I claim:

1. A system comprising:
a testing probe for use in testing an electrical circuit; and
apparatus for detecting whether the probe is in contact with an electrical circuit to be tested, said apparatus comprising:
capacitance measuring means;
first switch means between said measuring means and said probe, said first switch means having a first state in which it connects said probe to said measuring means and a second state in which it connects said probe to a testing input; and
control means connected with said measuring means, the apparatus being adapted so that, with said first switch means in its first state and with said probe not contacting an electrical circuit under test, said measuring means can measure a first capacitance value between said probe and ground, said value being stored in said control means, whereafter, with said first switch means in its first state and with said probe in a position in which it is in contact with a circuit under test, said measuring means can measure a second capacitance between said probe and ground, said second capacitance value being compared by said control means with the stored first capacitance 2. A system according to claim 1, wherein the switch means is a relay.

3. A system according to claim 1, wherein the apparatus comprises a capacitor connected between the first switch means and the measuring means.

4. A system according to claim 3, wherein the apparatus comprises second switch means connected between the capacitor and ground, said second switch means having a first, closed state in which it connects said capacitor to ground and a second, open state in which it does not connect said capacitor to ground.

* * * * *